US009922722B2

(12) United States Patent
Milani et al.

(10) Patent No.: US 9,922,722 B2
(45) Date of Patent: Mar. 20, 2018

(54) ANTIFUSE CELL WITH CAPACITOR AND TRANSISTORS

(71) Applicant: STMicroelectronics S.r.l., Agrate Brianza (IT)

(72) Inventors: Luca Milani, Mairano (IT); Fausto Carace, Monza (IT); Roberto Giorgio Bardelli, Fino Mornasco (IT); Giovanni Lanfranchi, Pavia (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/380,919

(22) Filed: Dec. 15, 2016

(65) Prior Publication Data

US 2017/0294234 A1   Oct. 12, 2017

(30) Foreign Application Priority Data

Apr. 7, 2016  (IT) .................. 102016000035692
Aug. 4, 2016  (IT) .................. 102016000082302

(51) Int. Cl.
*G11C 7/00* (2006.01)
*G11C 17/16* (2006.01)
*H01L 23/525* (2006.01)
*H01L 27/112* (2006.01)

(52) U.S. Cl.
CPC .......... *G11C 17/16* (2013.01); *H01L 23/5252* (2013.01); *H01L 27/11206* (2013.01)

(58) Field of Classification Search
CPC ................ G11C 17/16; H01L 23/5252; H01L 27/11206
USPC ...................................... 365/189.11
See application file for complete search history.

(56) References Cited

U.S. PATENT DOCUMENTS

| 5,194,759 | A | 3/1993 | El-Ayat et al. | |
| 6,545,928 | B1 * | 4/2003 | Bell ................. | G11C 17/18 365/200 |
| 6,667,902 | B2 | 12/2003 | Peng | |
| 7,253,496 | B2 * | 8/2007 | Jenne ............... | G11C 17/16 257/499 |
| 7,402,855 | B2 | 7/2008 | Kurjanowicz | |
| 8,395,923 | B2 * | 3/2013 | Chen ................ | G11C 17/18 365/102 |
| 2009/0196113 | A1 | 8/2009 | Jeong | |
| 2012/0051154 | A1 | 3/2012 | Son et al. | |

* cited by examiner

*Primary Examiner* — Pho M Luu
(74) *Attorney, Agent, or Firm* — Slater Matsil, LLP

(57) ABSTRACT

An antifuse cell includes an antifuse capacitor that is activatable with a breakdown voltage to provide an electrically conductive path through the capacitor. A pull-up transistor is coupled to the antifuse capacitor. A current path of the pull-up transistor is arranged in parallel with the antifuse capacitor. A shooting transistor is coupled to the pull-up transistor with the current paths of the pull-up transistor and a current path of the shooting transistor cascaded to each other.

20 Claims, 5 Drawing Sheets

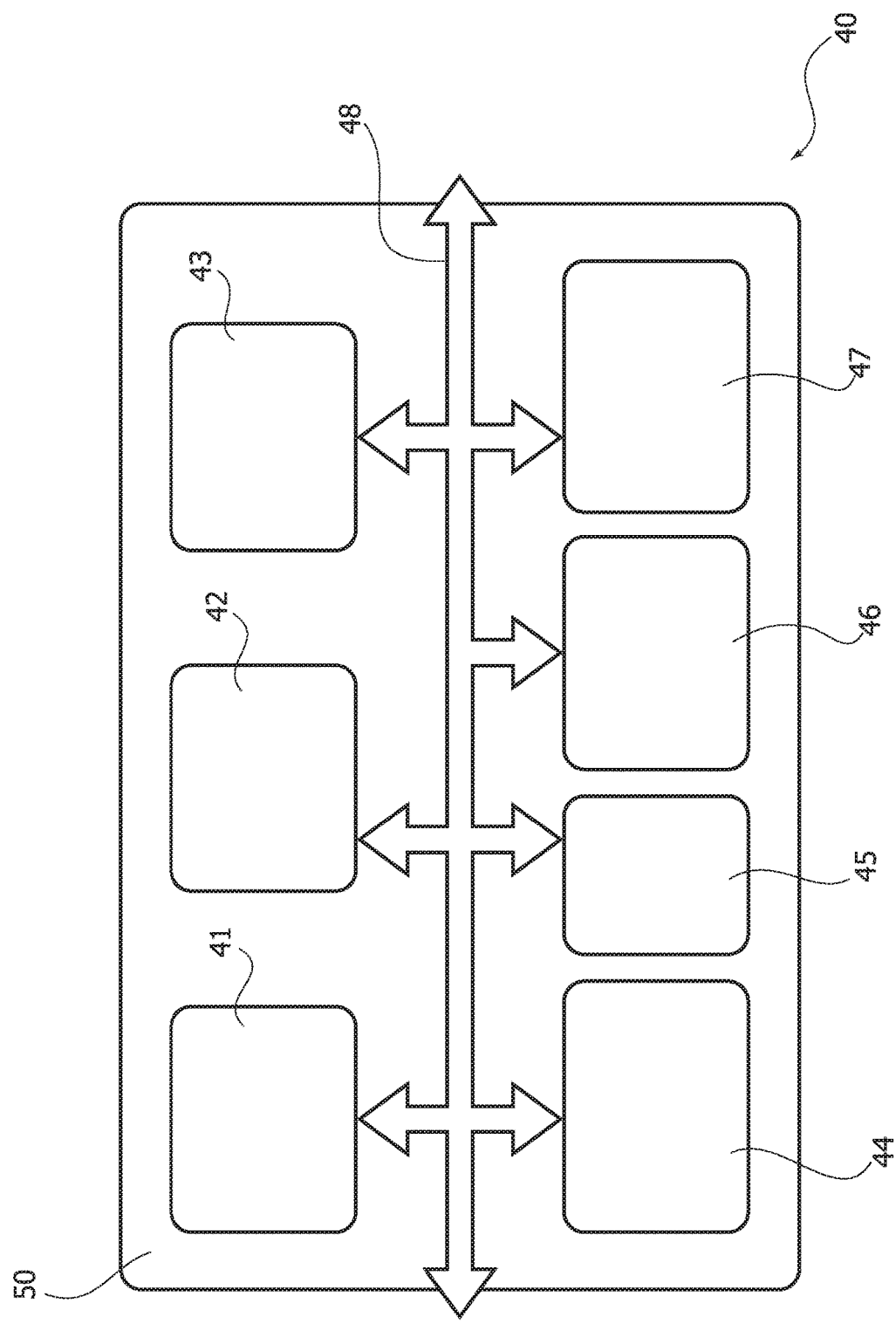

ANTIFUSE CELL WITH CAPACITOR AND TRANSISTORS

CROSS-REFERENCE TO RELATED APPLICATIONS

This application claims priority to Italian Patent Application No. 102016000082302, filed on Aug. 4, 2016 and Italian Patent Application No. 102016000035692, filed on Apr. 7, 2016, each of which application is hereby incorporated herein by reference.

TECHNICAL FIELD

The description relates to antifuse circuits. One or more embodiments may find application in the production of semiconductor circuits, such as integrated circuits (ICs).

BACKGROUND

The term "antifuse" is used to indicate an electrical circuit having behaviour opposite or complementary to that of a fuse.

A fuse is a component that presents a low resistance (e.g., it basically behaves like a short circuit) and, for example when the current that passes through it reaches a certain triggering threshold, "opens" or "burns", thus presenting a high resistance (e.g., it basically behaves like an open circuit, interrupting passage of current).

Instead, an antifuse presents a high resistance (e.g., it basically behaves like an open circuit) and, following upon an activation event, for example, when the voltage across it reaches a certain breakdown threshold, in the antifuse a (low-resistance) conductive path is created, so that the antifuse behaves like a conductive line.

Underlying the activation event there may be a phenomenon of dielectric breakdown. Such a phenomenon is brought about when a dielectric material subjected to a sufficiently high electrical field ceases to be insulating. In the solids, dielectric breakdown can be put down to an electrostatic discharge due to exceeding of the dielectric strength.

The antifuse may comprise a thin barrier of a dielectric material set between two metal conductors (in practice a capacitor). When a sufficiently high voltage is applied between these conductors, the dielectric layer may convert into a low-resistance, and hence conductive, material.

A possible field of application of antifuses is represented by (permanent) programming of semiconductor circuits, for example, integrated circuits such as memories. For instance, some programmable logic circuits such as ASICs may use antifuse technology for configuring logic circuits. A possible sector of application of antifuses is represented by non-volatile memories (NVMs), for example, in devices of the type referred to as Systems-on-Chip (SoCs).

Notwithstanding the extensive activity of innovation and research in the sector, there is still felt the need to provide antifuse solutions improved in terms of area of silicon occupied, reliability, and range of operating temperatures. For example, in sectors of application such as the vehicle sector, a factor to be taken into account in cell-antifuse implementations may be represented by the fact that, during programming, the cells that are not to be programmed may in any case be subjected to an electrical field of a certain importance (for example, equal to half the nominal electrical field), thus undergoing stresses.

This may constitute a risk from the standpoint of reliability. The inhibition times may prove longer than the individual programming so that there may arise the risk of undesired programmings in defective antifuse cells.

SUMMARY

One or more embodiments may also regard a corresponding circuit, as well as a corresponding electronic device (for example, a semiconductor device incorporating a nonvolatile memory, for instance, for a SoC component) and a corresponding method of use.

One or more embodiments enable an antifuse cell to be obtained, comprising an antifuse capacitor, a pull-up transistor, for example, of a pMOS type, and a shooting transistor, for example, of an nMOS type.

One or more embodiments may propose a matrix arrangement of cells complete with corresponding programming and reading schemes.

BRIEF DESCRIPTION OF THE DRAWINGS

One or more embodiments will now be described, purely by way of non-limiting example, with reference to the annexed figures, wherein:

FIG. 6 is a block diagram exemplifying a semiconductor device such as a SoC device.

DETAILED DESCRIPTION OF ILLUSTRATIVE EMBODIMENTS

In the ensuing description, various specific details are illustrated aimed at providing an in-depth understanding of various examples of embodiments according to the description. The embodiments may be obtained without one or more of the specific details, or with other methods, components, materials, etc. In other cases, known structures, materials or operations are not illustrated or described in detail so that that the various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Moreover, particular conformations, structures, or characteristics may be combined in any adequate way in one or more embodiments.

The references used herein are provided merely for convenience and hence do not define the sphere of protection or the scope of the embodiments.

Available on the market for some time now are various integrated antifuse circuit solutions, for example obtained in CMOS technology or the like.

These solutions may use, for example, the principle of hard breakdown of a thin gate oxide, with the hard breakdown that can be triggered in the presence of an electrical field of sufficient intensity applied for a certain time (the so-called programming time).

Breakdown of a gate oxide may be permanent in so far as during breakdown, within the gate oxide, a conductive filament is formed. The main block of an antifuse circuit may hence be represented in the initial state by a capacitor with a thin gate oxide, e.g., an open circuit, which in the final state, after programming, has the resistance of a conductive filament, namely, a closed circuit.

There exist various ways to provide a single antifuse cell and various modalities for arranging a cell of this sort in a matrix in order to reduce the area of silicon occupied.

Various solutions of antifuse circuit are known from documents such as U.S. Pat. No. 6,667,902 or 7,402,855.

Figure 1:
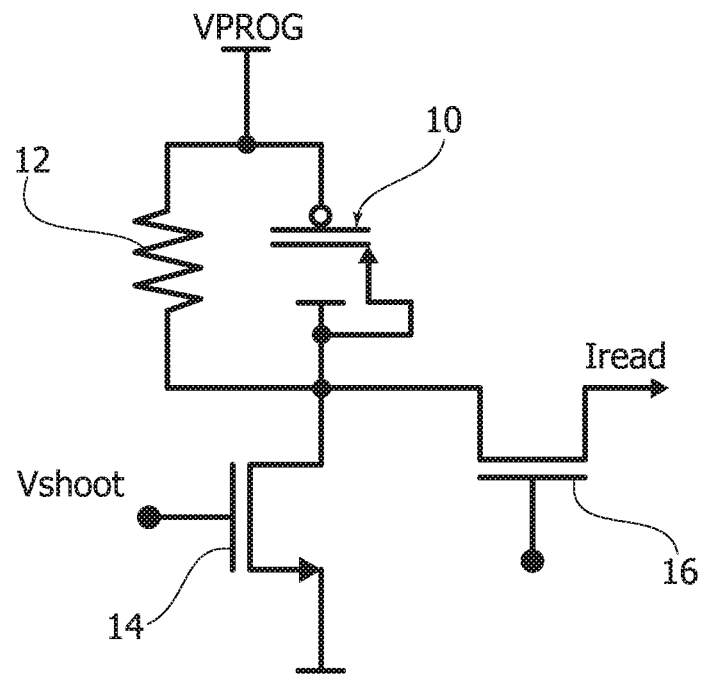
FIG. 1 is a principle diagram of an antifuse cell.

FIG. 1 exemplifies an antifuse circuit solution implemented at the premises of the present applicant.

This solution may comprise: an antifuse capacitor 10 (for example, of a pMOS type) with thin gate oxide (for example, 35 Å, $35.10^{-10}$ m); a resistor 12 (for example, a polysilicon resistor), connected in parallel to the antifuse capacitor 10; and two transistors 14 and 16 (for example, high-voltage drift-MOS transistors, available in BCD technology) with the function of shooting transistor and reading transistor, respectively.

When both of the transistors 14 and 16 are off (e.g., non-conductive) a zero electrical field is applied across the antifuse capacitor 10. No current passes in the resistance 12, which is parallel with the antifuse capacitor 10, which determines an applied voltage of 0 V.

Selection of an antifuse cell as the one represented in FIG. 1 for programming purposes (e.g., to obtain replacement of the capacitor 10 with a low-ohmic-resistance path) may entail activating (e.g., turning on, namely, rendering conductive) the shooting transistor 14, for example, applying a corresponding voltage $V_{shoot}$ to the gate of the transistor 14. In this way, it is possible to bring the terminal of the capacitor 10 facing the transistor 14 to a ground value (0 V), whereas the opposite terminal remains at a voltage level VPROG. In this way, it is possible to induce a high electrical field across the capacitor 10 and cause the gate oxide to "break" in a short time.

The reading operation envisages, instead, that the shooting transistor 14 is turned off while the reading transistor 16 is turned on (e.g., rendered conductive), optionally lowering the supply voltage so as to not produce undesired programming.

Reading of the datum can thus take place by reading the read current $I_{read}$ that passes through the antifuse cell selected.

A solution like the one exemplified in FIG. 1 may prove such as not to facilitate a matrix arrangement, nor programming in parallel of two or more bits.

Figure 2:
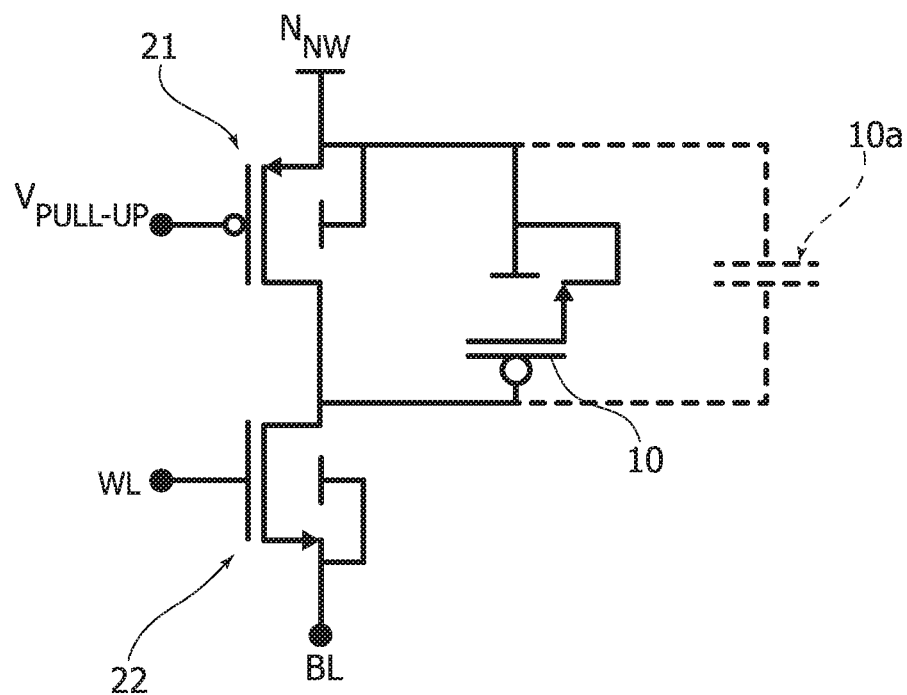
FIG. 2 is a scheme of antifuse cells according to one or more embodiments.

One or more embodiments as exemplified in FIG. 2 may envisage combining to a capacitor (for example, of a pMOS type) 10 with thin gate oxide (for example, of 35 Å, namely $35.10^{-10}$ m) a pair of transistors with thick gate oxide (for example, of 120 Å, namely $120.10^{-10}$ m), for instance, a pMOS transistor 21 and an nMOS transistor 22 with the capacitor 10 set between the source and the drain of the transistor 21 functioning as pull-up transistor and the transistor 22 functioning as shooting transistor set with its current path (from source to drain) cascaded to the current path (from source to drain) of the transistor 21.

Figure 3:
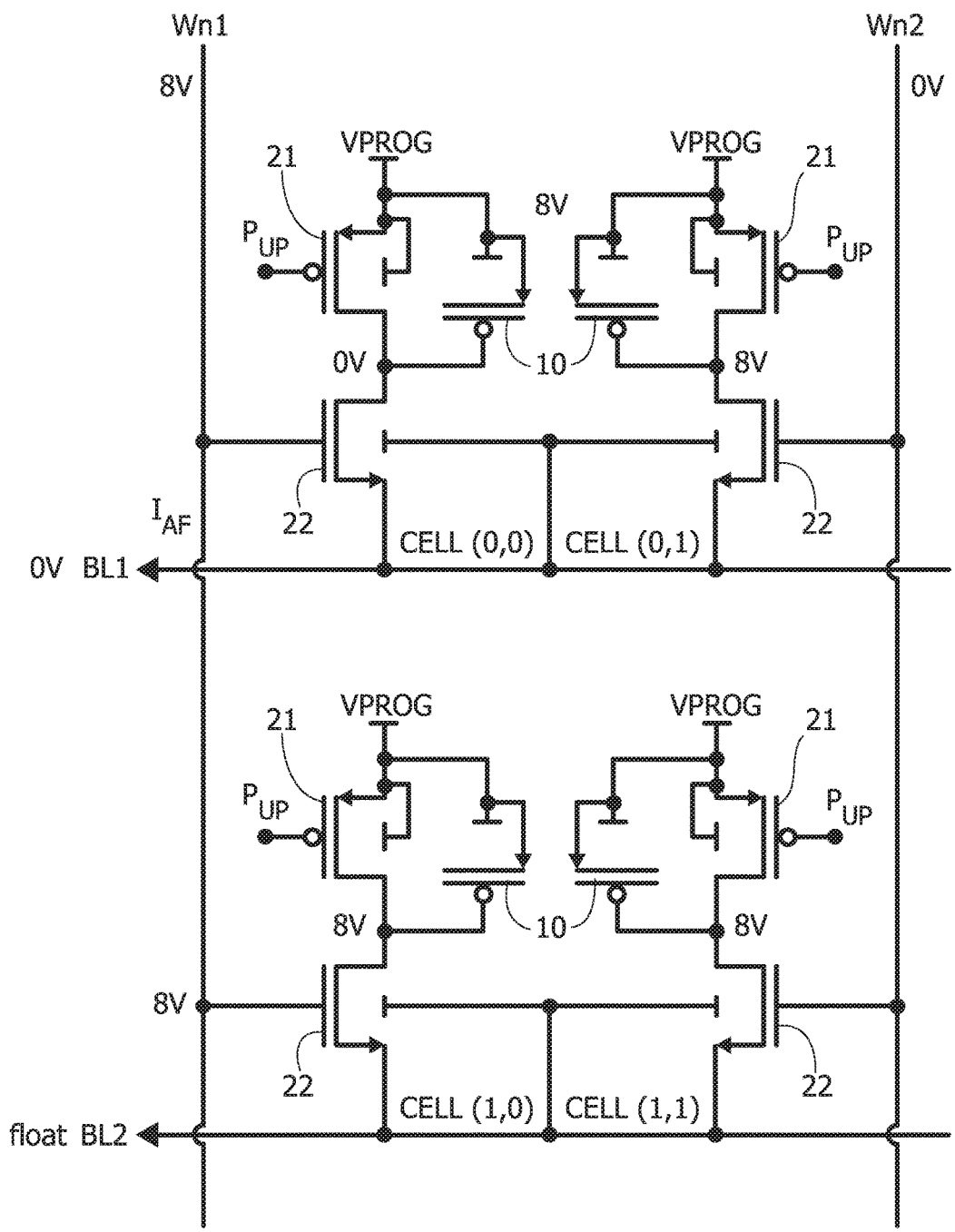
FIGS. 3 and 4 illustrate possible solutions in which a cell as presented in FIG. 2 is comprised in a cell structure presented, respectively, in the programming condition (FIG. 3) and in the reading condition (FIG. 4)
Figure 4:
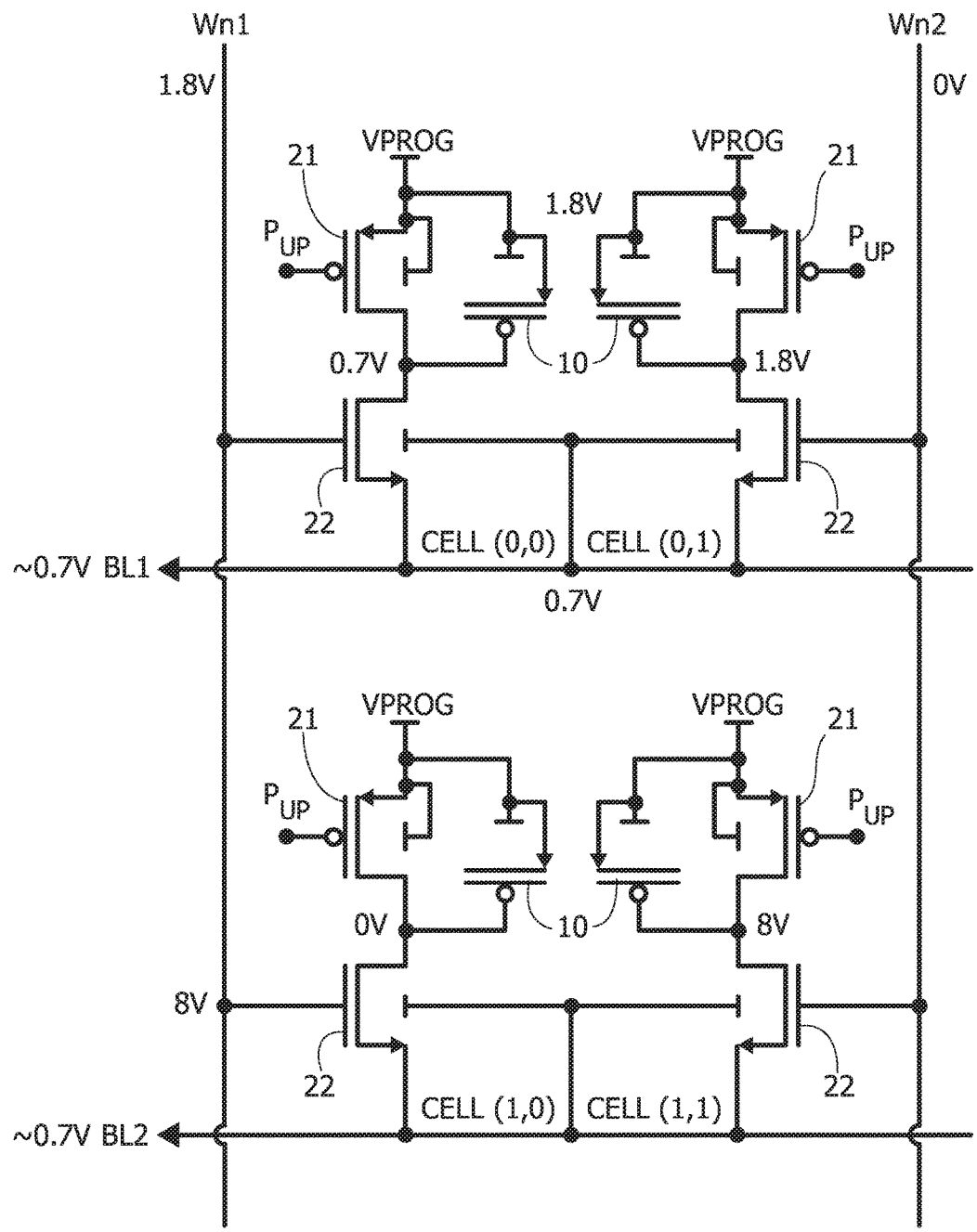

A cell as exemplified in FIG. 2 is suited to being included in a set of antifuse cells arranged in matrix form (see for example, FIGS. 3 and 4). The source terminal of the pull-up transistors 21 ($V_{NW}$ in FIG. 2) is coupled to a programming-voltage line VPROG. The gate terminals of the pull-up transistors (for example, of a pMOS type) 21 are connected to a single terminal $P_{UP}$ (not presented as such in FIGS. 3 and 4 to prevent burdening of the graphic representation). In addition, the gate terminals of the transistors 22 (for example, of an nMOS type) are coupled in columns or words Wn1, Wn2, . . . , Wnx, and source terminals of the same transistors are coupled in rows BL1, BL2, . . . , BLx.

FIGS. 3 and 4 refer for simplicity to a 2×2 matrix comprising four cells CELL (0,0), CELL (0,1), CELL (1,0), CELL (1,1) arranged in two columns (words) of two cells each.

This representation is made for simplicity of presentation but may be clearly extended to matrices of higher rank (even much higher), without prejudice to the fact that, in general, the control electrodes, e.g., the gates, of the shooting transistors 22 are coupled to a plurality of first electrical lines (for example, columns) Wn1, Wn2, . . . , Wnx, and the current paths (for example, the sources) of the shooting transistors 22 are coupled to a plurality of second electrical lines (for example, rows) BL1, BL2, . . . , BLx.

In this way, each shooting transistor 22 is set (from the electrical standpoint) between one of the first lines Wn1, Wn2, . . . , Wnx and one of the second lines BL1, BL2, . . . , BLx, with the lines that form jointly a pair of electrical lines such as to identify uniquely the transistor and hence the cell in which it is comprised.

It is thus possible to provide a structure of a matrix type in which each cell of the matrix comprises: a capacitor 10 (for example, of a pMOS type) with thin gate oxide connected in parallel to a first transistor (of a pull-up, for example, pMOS, type) 21, and a second transistor (of a shooting, for example, nMOS, type) 22, the source-to-drain current path of which is set in series with the source-to-drain current path of the pull-up transistor 21.

Moreover, the sources and gates of the pull-up transistors 21 are connected, respectively, to the voltage VPROG and to the pull-up voltage $P_{UP}$.

The arrangement in rows and columns typical of the matrix is hence obtained mainly at the level of the second transistors 22 (nMOS), each of which has its gate (control electrode) connected to a respective column Wn1, Wn2, . . . , Wnx of the matrix and its source (current path) connected to a respective row BL1, BL2, . . . , BLx of the matrix.

Assuming—purely by way of example—programming via writing of the top left cell CELL (0,0) (it is assumed that the other cells are not programmed), it is possible to consider selecting the first word Wn1 by applying thereto, as schematically indicated in FIG. 3, a voltage of 8 V (which is applied to the gates of the transistors 22), whereas the other columns, represented in the simplified example proposed herein by the other column Wn2, on the right in FIG. 3, are not selected, so that the gates of the corresponding transistors 22, connected to the column Wn2, remain at a voltage of 0 V.

If the aim is to select the top left cell (hence at the crossing between the left-hand column Wn1—brought up to 8 V—and the first row BL1 of the matrix) the first row BL1 can be selected by applying (for example, to the sources of the transistors 22 connected to that line) a voltage of 0 V, while the other rows (in the present simplified case of a 2×2 matrix, the second row BL2) can be kept floating.

The pull-up transistors 21 can be turned on, for example, by driving them in current, which means that, for instance, each transistor 21 can force a current of, for example, 1-10 µA, namely $1\text{-}10.10^{-6}$ A.

In this way, the top left cell CELL (0,0) (assumed as example of the cell that is to be selected) will be the only one to have both transistors 21 and 22 turned on, e.g., conductive.

With the modalities illustrated previously, the transistor 22 can be driven so as to present a conductivity higher than that of the transistor 21 so that the drain terminal (common to the two transistors) will be brought to a voltage substantially corresponding to the voltage applied to the line BL1, e.g., for example 0 V.

At this point, across the capacitor 10 comprised in the cell in question a voltage is set up (in practice equal to the programming voltage VPROG), which is able to give rise to an electrical field, which, applied to the thin gate oxide of the capacitor 10, determines (in short times) breakdown thereof.

Once breakdown of the oxide has occurred, a current will be able to pass through the capacitor 10 with the drain terminal common to the two transistors 21 and 22 that can go to an intermediate value between the voltage VPROG and the voltage applied on the line BL1 (at 0 V).

In the other cells of the matrix the (other) capacitors 10 will not be stimulated by the electrical field. In fact, the transistors 22 (except that of the cell selected, the top left cell) are de-activated, and each associated pull-up transistor 21 brings the drain terminal set between the two transistors to a voltage substantially equal to the voltage VPROG, thus causing the voltage jump through the associated capacitor 10 to be practically zero.

In particular, it may be noted that, in the operating mode exemplified herein, the transistor 22 in the top right cell is turned off (e.g., non-conductive) in so far as its gate-to-source voltage is practically 0 V. The two transistors 22 in the bottom cells are likewise inactive in so far as the terminal BL that comes under the respective source is floating.

One or more embodiments as exemplified herein enable programming of two or more antifuse cells of one and the same word according to how the terminal BL1, BL2, . . . associated thereto is biased. In this way, it is possible to reduce the times of programming of an antifuse cell.

Selection of the cell to be read may be made in a way similar to the programming described previously.

During reading, the supply voltage of the matrix can be lowered (for example, passing from VPROG of, for example, 8 V to VPROG of approximately 1.8 V) with the pull-up transistors 21 that can be turned off by acting on the respective terminal $P_{UP}$.

For example, reading of the data can be performed by reading the current that passes through the antifuse cell selected (consider for simplicity once again the top left cell in FIG. 4) also exploiting the matrix parallelism.

Also to be considered is the fact that—in the cell in which, during programming, to the gate oxide of the capacitor 10 the voltage that has produced breakdown thereof has been applied—the capacitor 10 functions in practice as short circuit between the (source and drain) terminals of the respective pull-up transistor 21.

Figure 5:
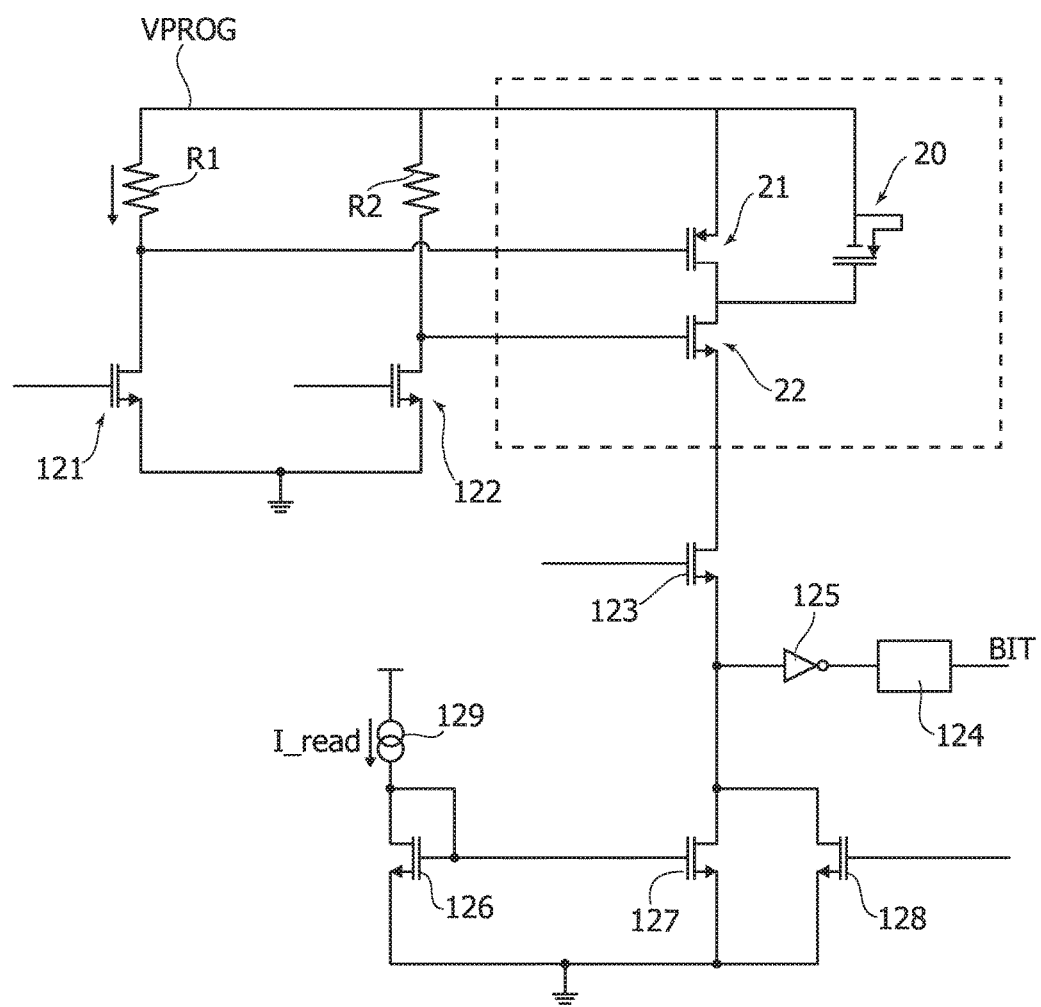
FIG. 5 exemplifies a possible circuit implementation of the scheme of FIG. 2.

The scheme of FIG. 5 represents the possible implementation of a mechanism of addressing of the single cell within a matrix scheme of the type exemplified previously.

In particular, the references 121 and 122 designate two electronic switches (for example, MOSFETs) that are able to drive the gates of the transistors 21 and 22 bringing them to voltage levels such as (with reference to the values indicated previously) values equal to 8 V or 1.8 V.

The reference 123 designates, instead, a further electronic switch (also in this case, it may be an nMOSFET) that enables the function of selection of the row BL1, BL2, . . . , to be carried out by bringing the source of the transistor 22 to the level of ground (0 V, row selected) or else keeping it floating.

Visible in the bottom part of FIG. 5 is a set of circuits that can be used for reading, such as a latch 124 (possibly preceded by a logic inverter 125), which is able to sense the logic level present on the source of the MOSFET 123 (for example, a "low" logic level for a virgin cell, in which the oxide of the capacitor 10 has not yet been rendered conductive, and a "high" logic level in the case of a cell in which the oxide of the capacitor 10 has already been perforated).

The references 126, 127, and 128 designate three (CMOS) transistors coupled according to a scheme that is substantially equivalent to a current mirror designed to couple selectively the source of the transistor 126 to a source of read current I_read 129 according to the logic level applied on the gate of the transistor 128.

The dashed line in FIG. 2 exemplifies the possibility of the capacitor 10 with antifuse function being, so to speak, "split" into two capacitors envisaging coupling thereto, optionally in parallel (e.g., with identical voltage across them), a further capacitor designated by 10a, which may present the same general features as the capacitor 10 and the characteristics exemplified in greater detail in what follows.

One or more embodiments may adopt this solution preserving the characteristics (for example, the matrix arrangement) of the embodiments discussed previously. In other words, in one or more embodiments, the modifications exemplified with a dashed line in FIG. 2 may regard only the antifuse capacitor 10, 10a comprised in each individual cell (bit-cell), with the transistors 21 (for example, of a pMOS type) and 22 (for example, of an nMOS type) that are not modified.

In one or more embodiments, to a first antifuse capacitor 10, which may present a thin gate oxide (for example, of 35 Å) there may be coupled, as exemplified with a dashed line in FIG. 2, a second antifuse capacitor 10a, for example, connected in parallel, which also may present a thin gate oxide (for example, of 35 Å; 1 Å=$10^{-10}$ m).

In one or more embodiments, the two capacitors 10 and 10a may present a gate polysilicon (gate poly) with the same type of doping, for example, of a P+ type.

In one or more embodiments, the two capacitors 10 and 10a may present different levels of doping of the body, with the first capacitor 10 having a body with, for example, an NW type of doping, e.g., a doping of an N type, whereas the second capacitor 10a has a PW body, hence of a P type.

For example, in one or more embodiments, the two capacitors 10, 10a connected in parallel may present the following gate-stack structure: P+poly/35 Å/NW and P+poly/35 Å/PW, respectively.

In one or more embodiments, the presence of the two capacitors 10, 10a facilitates improvement of the programming and reading performance, without increasing in an appreciable way the area occupied by the individual cell on silicon. In one or more embodiments, during the programming and reading operations (which can be carried out as exemplified previously) it is possible to apply to both of the capacitors 10, 10a the same voltages, and the same electrical stimulus, if the capacitors are connected in parallel as illustrated with a dashed line in FIG. 2.

In one or more embodiments, the second capacitor 10a may be programmable more easily than the first capacitor 10 since, given the same voltage applied, across the gate oxide there may be applied a higher electrical field.

In one or more embodiments, achievement of the above result can be facilitated by the gate-stack structure of the second capacitor 10a exemplified previously.

In one or more embodiments, during programming, the first capacitor 10 may be working in a reverse region, whereas the second capacitor 10a may be working in the storage region.

For instance (of course, the values provided hereinafter have a purely indicative and non-limiting value), considering by way of example a programming pulse VPROG of 8V, the electrical field $E_{CAP1}$ in the first capacitor 10 is:

$$E_{CAP1}=(V_{PROG}-V_{TH})/t_{OX}=(8V-0.6V)/35\ \text{Å}=21\ \text{MV/cm}$$

where $V_{TH}$ and $t_{OX}$ are, respectively, the threshold voltage of the MOS capacitor (P+poly/35 Å/PW) and the thickness of the gate oxide (for example, 35 Å), whereas the electrical field $E_{CAP2}$ in the second capacitor is $$E_{CAP2}=V_{PROG}/t_{OX}=8V/35\ \text{Å}=23\ \text{MV/cm.}$$

The second MOS capacitor may consequently present a zero threshold voltage in the operating region of the application considered herein.

It should be noted that the programming performance may depend exponentially upon the electrical field applied across the antifuse capacitor.

For this reason, an increase such as the one exemplified here, equal to approximately 10% of the electrical field given the same voltage applied, can facilitate improvements of performance to be achieved, for example, in terms of programming time and oxide-shooting current.

Also the read current can increase for the same reason so that one or more embodiments as represented with a dashed line in FIG. 2 may entail advantages also in terms of a more robust reading, capable of discriminating better a shooted antifuse from an intact one.

In one or more embodiments as exemplified herein, an antifuse cell may consequently comprise an antifuse capacitor (for example, 10) which is activatable—e.g., "breakable"—with a breakdown voltage to provide an electrically conductive path through the capacitor, a pull-up transistor (for example, 21) coupled to the antifuse capacitor with the current path (for example, source-to-drain, in the case where it is a field-effect transistor, or FET) of the pull-up transistor in parallel to the antifuse capacitor, and a shooting transistor (for example, 22), coupled to the pull-up transistor with the current paths of the pull-up transistor and of the shooting transistor cascaded (e.g., set in series) to one another.

For example, in one or more embodiments, the pull-up transistor may face the supply line (for example, $V_{NW}$) and the shooting transistor may be set between the connection in parallel of the pull-up transistor and of the antifuse capacitor and ground.

One or more embodiments may include a further antifuse capacitor (for example, 10a), the antifuse capacitor and the further antifuse capacitor being coupled together and being activatable with a breakdown voltage for providing an electrically conductive path through them, wherein the antifuse capacitor and the further antifuse capacitor comprise bodies with different doping, of an N type and of a P type.

In one or more embodiments, the antifuse capacitor and/or the further antifuse capacitor may comprise a dielectric layer breakable via the breakdown voltage.

In one or more embodiments, the antifuse capacitor and/or the further antifuse capacitor may comprise a MOS capacitor with the breakable dielectric layer comprising a gate oxide.

In one or more embodiments, the antifuse capacitor and the further antifuse capacitor may include identically doped gates, preferably P-type.

In one or more embodiments, the antifuse capacitor and the further antifuse capacitor may include identical gate stack structures.

In one or more embodiments, the pull-up transistor and the shooting transistor may comprise field-effect transistors, for example, MOSFETs.

In one or more embodiments, the pull-up transistor may comprise a pMOS transistor.

In one or more embodiments, the shooting transistor may comprise an nMOS transistor.

One or more embodiments may envisage a circuit comprising a plurality of antifuse cells as exemplified herein. The control electrodes of the pull-up transistors of the cells in the plurality of cells are coupled to a common pull-up line (for example, $P_{UP}$). The shooting transistors of the cells in the plurality of cells are coupled in matrix form with the control electrodes (for example, gates, in the case of FETs) of the shooting transistors coupled to a plurality of first electrical lines (for example, Wn1, Wn2), and the current paths (for example, the current emitting electrodes, e.g., the sources in the case of FETs) of the shooting transistors coupled to a plurality of second electrical lines (BL1, BL2), so that each shooting transistor is set between one of the first electrical lines and one of the second electrical lines, thus being individually addressable within the matrix scheme.

One or more embodiments may regard an electronic device (for example, a memory, such as a non-volatile memory in a SoC component) comprising a circuit as exemplified herein.

One or more embodiments may regard a method of use of a circuit as exemplified herein, with the possibility of activating (e.g., rendering conductive) selectively the shooting transistors of the cells in the plurality of cells by activating (see, for example, VPROG, R1, R2, 121, 122 in FIG. 5) the antifuse capacitor or capacitors of the respective cell (e.g., of the cell comprising the shooting transistor considered) with a voltage applied between one of the first electrical lines and one of the second electrical lines, and/or by detecting (see, for example, 123, 124, 125, 126, 127, 128 in FIG. 5) the state (non-conductive/conductive) of the antifuse capacitor or capacitors of the respective cell, detecting the current between the one of the first electrical lines and the one of the second electrical lines with the pull-up transistors of the plurality of cells de-activated.

FIG. 6 is a block diagram provided by way of example of a semiconductor device such as a System-on-Chip (SoC) that may incorporate one or more embodiments.

It may be, for example, a SoC 40 that can be mounted on boards 50 designed to be inserted in a final electronic product, not visible in the figures.

By way of example, FIG. 6 illustrates a system comprising, according to criteria in themselves known, the following elements:

digital input/output 41;
processor or finite-state machine 42;
analog module 43;
nonvolatile memory (for example, ROM, antifuse OTP, MTP, or flash) 44;
random-access memory (RAM) 45;
module for management of the power supplies 46;
other (possible) peripherals; and
system bus 48.

One or more embodiments are suited, for example, for being used to provide an antifuse OTP memory (block 44 in FIG. 6) which may be compatible, for example, with SoC products for the vehicle sector, with the possibility of reducing the silicon area of the end product, thus reducing the cost of the end product itself.

Without prejudice to the underlying principles, the details of construction and the embodiments may vary, even significantly, with respect to what is illustrated herein purely by way of non-limiting example, without thereby departing from the extent of protection.

The extent of protection is defined by the annexed claims.

What is claimed is:

1. An antifuse cell, comprising:
   an antifuse capacitor that is activatable with a breakdown voltage to provide an electrically conductive path through the antifuse capacitor;
   a pull-up transistor coupled to the antifuse capacitor, a current path of the pull-up transistor arranged in parallel with the antifuse capacitor; and
   a shooting transistor coupled to the pull-up transistor with the current path of the pull-up transistor and a current path of the shooting transistor cascaded to each other.

2. The antifuse cell of claim 1, wherein the antifuse capacitor includes a dielectric layer breakable by the breakdown voltage.

3. The antifuse cell of claim 2, wherein the antifuse capacitor comprises a MOS capacitor with the dielectric layer.

4. The antifuse cell of claim 3, wherein the MOS capacitor comprises a pMOS capacitor and wherein the dielectric layer comprises a gate oxide.

5. The antifuse cell of claim 1, wherein the pull-up transistor and the shooting transistor comprise field effect transistors.

6. The antifuse cell of claim 5, wherein the pull-up transistor comprises a pMOS transistor.

7. The antifuse cell of claim 6, wherein the shooting transistor comprises an nMOS transistor.

8. The antifuse cell of claim 1, further comprising a further antifuse capacitor, the antifuse capacitor and the further antifuse capacitor being mutually coupled and activatable with a breakdown voltage to provide an electrically conductive path therethrough, wherein the antifuse capacitor and the further antifuse capacitor include differently doped bodies, of N-type and P-type.

9. The antifuse cell of claim 8, wherein the further antifuse capacitor comprises a dielectric layer breakable by the breakdown voltage.

10. The antifuse cell of claim 9, wherein the further antifuse capacitor comprises a MOS capacitor and the dielectric layer comprises a gate oxide of the MOS capacitor.

11. The antifuse cell of claim 8, wherein the antifuse capacitor and the further antifuse capacitor comprise identically doped gates.

12. The antifuse cell of claim 8, wherein the antifuse capacitor and the further antifuse capacitor comprise identically doped P-type gates.

13. The antifuse cell of claim 8, wherein the antifuse capacitor and the further antifuse capacitor comprise identical gate stack structures.

14. The antifuse cell of claim 8, wherein the antifuse capacitor and the further antifuse capacitor are arranged in parallel to each other.

15. A circuit comprising:
    a plurality of antifuse cells, wherein each of the antifuse cells comprises:
        an antifuse capacitor that is activatable with a breakdown voltage to provide an electrically conductive path through the antifuse capacitor,
        a pull-up transistor coupled to the antifuse capacitor, the pull-up transistor having a control electrode and a current path that is arranged in parallel with the antifuse capacitor, and
        a shooting transistor coupled to the pull-up transistor, the shooting transistor having a control electrode and a current path cascaded with the current path of the pull-up transistor;
    a common pull-up line, wherein the control electrodes of the pull-up transistors the plurality of antifuse cells are coupled to the common pull-up line;
    a plurality of first electrical lines, wherein the control electrodes of the shooting transistors are coupled with the plurality of first electrical lines; and
    a plurality of second electrical lines, wherein the current paths of the shooting transistors are coupled with a plurality of second electrical lines, the shooting transistors of the plurality of antifuse cells being coupled in a matrix arrangement, wherein each shooting transistor is set between one of the first electrical lines and one of the second electrical lines.

16. The circuit of claim 15, wherein the circuit is part of a non-volatile memory component.

17. The circuit of claim 16, wherein the circuit is part of a system-on-chip integrated circuit.

18. A method of operating the circuit of claim 15, the method comprising selectively activating the shooting transistors of the plurality of antifuse cells by activating the antifuse capacitor or capacitors of the respective cell with a voltage applied between one of the first electrical lines and one of the second electrical lines.

19. A method of operating the circuit of claim 15, the method comprising selectively activating the shooting transistors of the plurality of antifuse cells by detecting a state of the antifuse capacitor or capacitors by detecting a current between one of the first electrical lines and one of the second electrical lines, with the pull-up transistors of the plurality of antifuse cells being de-activated.

20. An antifuse cell, comprising:
    an antifuse capacitor comprising a MOS capacitor with a dielectric layer that is breakable with a breakdown voltage to provide an electrically conductive path through the antifuse capacitor;
    a pull-up transistor coupled to the antifuse capacitor, the pull-up transistor comprising a pMOS transistor with a gate and a current path that is arranged in parallel with the antifuse capacitor; and
    a shooting transistor coupled to the pull-up transistor, the shooting transistor comprising an nMOS transistor having a gate and a current path cascaded with the current path of the pull-up transistor.

* * * * *